(12) United States Patent
Bellani et al.

(10) Patent No.: US 11,859,113 B2
(45) Date of Patent: Jan. 2, 2024

(54) ELECTRICALLY CONDUCTIVE ADHESIVE

(71) Applicant: FONDAZIONE ISTITUTO ITALIANO DI TECNOLOGIA, Genoa (IT)

(72) Inventors: Sebastiano Bellani, Casella (IT); Leyla Najafi, Genoa (IT); Pierenrico Zani, Genoa (IT); Beatriz Martin-Garcia, San Sebastian (ES); Reinier Oropesa-Nuñez, Genoa (IT); Francesco Bonaccorso, Genoa (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 344 days.

(21) Appl. No.: 17/432,002

(22) PCT Filed: Feb. 19, 2020

(86) PCT No.: PCT/IB2020/051380
§ 371 (c)(1),
(2) Date: Aug. 18, 2021

(87) PCT Pub. No.: WO2020/170154
PCT Pub. Date: Aug. 27, 2020

(65) Prior Publication Data
US 2022/0135851 A1    May 5, 2022

(30) Foreign Application Priority Data
Feb. 19, 2019    (IT) .................. 102019000002397

(51) Int. Cl.
*C09J 9/02*        (2006.01)
*H01M 50/524*    (2021.01)
(Continued)

(52) U.S. Cl.
CPC .    *C09J 9/02* (2013.01); *C09J 5/00* (2013.01); *C09J 123/0853* (2013.01);
(Continued)

(58) Field of Classification Search
CPC .......... C09J 9/02; C09J 5/00; C09J 123/0853; C08K 3/041; C08K 3/042; C08K 2201/001; H01G 9/2068; H01L 31/0201
See application file for complete search history.

(56) References Cited

U.S. PATENT DOCUMENTS

2012/0145315 A1*   6/2012   Knaapila .................. H01B 1/22
                                                              264/440

FOREIGN PATENT DOCUMENTS

CN    104744788 A    7/2015
CN    107325477 A    11/2017
(Continued)

OTHER PUBLICATIONS

International Search Report and Written Opinion for corresponding PCT/IB2020/051380 dated May 18, 2020.

*Primary Examiner* — Daniel McNally
(74) *Attorney, Agent, or Firm* — Armstrong Teasdale LLP (57) ABSTRACT

An electrically conductive adhesive composition, free of metals and metal salts, includes an adhesive polymer component selected from polyethylene-vinyl acetate, polyolefin elastomers, polyvinyl butyral, poly(acrylic acid), polyacrylates and poly(methyl methacrylate) from 5% to 40% by weight, an electrically conductive component including acetylene or carbon black nanoparticles, carbon nanotubes, and flakes or plates of graphene or graphene derivatives from 60% to 95% by weight, percentages by weight of the adhesive polymer component and electrically conductive component, the electrically conductive component consisting of acetylene or carbon black nanoparticles from 15% to (Continued)

45% by weight, carbon nanotubes from 5% to 25% by weight, and flakes or plates of graphene or graphene derivatives from 35% to 70% by weight, percentages by weight of the electrically conductive component, and a solvent compatible with the adhesive polymer component from 50% to 90% by weight of the electrically conductive adhesive composition.

14 Claims, 4 Drawing Sheets

(51) Int. Cl.
| | |
|---|---|
| C09J 5/00 | (2006.01) |
| C09J 123/08 | (2006.01) |
| C09J 133/02 | (2006.01) |
| H01G 9/20 | (2006.01) |
| H01G 11/76 | (2013.01) |
| H01L 31/02 | (2006.01) |
| C08K 3/04 | (2006.01) |
| H01L 31/0747 | (2012.01) |

(52) U.S. Cl.
CPC .......... *C09J 133/02* (2013.01); *H01G 9/2068* (2013.01); *H01G 11/76* (2013.01); *H01L 31/0201* (2013.01); *H01M 50/524* (2021.01); *C08K 3/041* (2017.05); *C08K 3/042* (2017.05); *C08K 2201/001* (2013.01); *C08K 2201/011* (2013.01); *C09J 2423/00* (2013.01); *C09J 2431/00* (2013.01); *C09J 2433/00* (2013.01); *H01L 31/0747* (2013.01)

(56) References Cited

FOREIGN PATENT DOCUMENTS

| | | | |
|---|---|---|---|
| CN | 108384103 A | | 8/2018 |
| CN | 109320893 A | | 2/2019 |
| CN | 110205088 A | * | 9/2019 |
| WO | 2017089987 A1 | | 6/2017 |
| WO | 2018013342 A1 | | 1/2018 |

* cited by examiner

ELECTRICALLY CONDUCTIVE ADHESIVE

CROSS-REFERENCE TO RELATED APPLICATIONS

This application is a National Stage Application of International Patent Application No. PCT/IB2020/051380, having an International Filing Date of Feb. 19, 2020, which claims the benefit of priority to Italian Patent Application No. 102019000002397, filed Feb. 19, 2019, the entire contents of which are hereby incorporated by reference herein.

FIELD OF THE INVENTION

The present invention relates to the field of electrically conductive adhesives (ECAs), particularly for photovoltaic (PV) and energy storage applications (batteries and supercapacitors).

BACKGROUND OF THE INVENTION

Electrically conductive adhesives have been developed to make interconnections in electronic devices, including system-in-package (SIP) and energy conversion and storage modules. In fact, they constitute an attractive alternative to traditional tin (Sn)-lead (Pb)-based welding. In addition, ECAs can also represent the sole feasible solution for production protocols that require a temperature lower than that reached by traditional welding (typically greater than 180° C. for Sn—Pb-based welding), as can occur in the presence of thermally sensitive plastic materials and semiconductors.

Over the last decade, ECAs have found application in the field of silicon-based heterojunction solar cells (HJT-Si), which have presently achieved exceptional energy conversion efficiency (greater than 26%). However, the efficiency advantage for HJT-Si modules, compared to conventional crystalline silicon (c-Si)-based modules, is counteracted by a strong increase in metallization costs for the realization of HJT-Si projects, since large quantities of Ag paste are required which can be processed at temperatures lower than 200° C., compatibly with the thermochemical stability of the material components.

In the design of HJT-Si, ECAs are commonly used for the connection of the HJTs inside a solar module, that is, the connection of current collectors of several solar cells. In greater detail, HJTs consist of a stack of layers made as follows: a layer of crystalline silicon (c-Si) is passivated on both sides by layers of hydrogenated intrinsic amorphous silicon (i-a-Si:H), deposited by Plasma Enhanced Chemical Vapor Deposition. A doped layer of n-type (n-a-Si:H) and p-type (p-a-Si: H) hydrogenated amorphous silicon is respectively deposited on the two layers of i-a-Si:H by Plasma Enhanced Chemical Vapor Deposition. Two layers of transparent conductive oxide (TCO) (obtained by Physical Vapor Deposition) are respectively deposited over the layers of n-a-Si:H and p-a-Si: H. Two silkscreen-printed metal contact grids are respectively deposited over the TCO layers of the cell. The metal grids consist of rectangular printed strips (busbars) perpendicular to "super-thin" grid fingers (contact fingers). The aim of the contact fingers is to collect the current generated by the cell and transfer it to the busbars. Finally, copper (Cu)-based conductive ribbons are bonded to the busbars through the use of ECAs to connect the cells inside a module in a mechanically and electrically robust, reproducible way. Perspectively, the replacement of conventional ECAs filled with silver (Ag) would result in a significant reduction in the metallization costs of the present HJT-Si, which could thus reach production costs lower than USD 0.4/part (present cost between USD 0.48 and USD 0.56/part).

The use of potentially cost-effective ECAs can also be advantageous not only for HUT-Si, but also for all other types of silicon-based solar cells. Clearly, in c-Si-based solar cells, the connection of conductor ribbons to the busbars through thermal welding of the ribbon to the busbar represents a rigid "frozen" connection, which generates mechanical stresses due to the difference in the coefficient of thermal expansion of Cu and Si. Typically, thermo-mechanical fatigue effects, which occur both during the metallization of solar cells and in the operation of solar cells subjected to weather variations (temperature fluctuations), constitute "hot spots" that dissipate ohmic power losses and wherein cracks in the silicon, interruptions of electrical contacts and possible risks of electric arcs and fire can occur. All these effects limit both the durability of the solar modules and the minimum "non-crackable" thickness of the c-Si wafer to 180 µm, thus preventing, in practice, the theoretical minimum costs of the solar cells from being achieved.

Another emerging application of ECAs is related to perovskite solar cells (PSCs); these are hybrid inorganic-organic solar cells on which PV research is focusing, thanks to their energy conversion efficiency exceeding 20%. Perspectively, these could be produced by low-cost and possibly low-temperature (<100° C.) liquid-phase processes which are economically acceptable and compatible with the thermochemical stability of perovskites themselves, which degrade at temperatures greater than 100/120° C. (depending on the type of perovskite). Unfortunately, the most efficient PSCs use expensive gold (Au) electrodes. Metal electrodes, including Au electrodes, are presently known to cause degradation of devices due to metal-ion migration effects. The development of low-cost electrodes that may replace Au or other metals and ensure both the efficiency and stability of PSCs is essential for the spread of such solar cell technology, as well as of the corresponding perovskite solar modules (PSMs). Furthermore, the possibility of processing the aforementioned ECAs at low temperatures (<100° C., including room temperature) would make them exclusive in such context for a production of PSCs through liquid-phase deposition techniques, including material molding techniques.

Finally, ECAs are applied so as to mechanically and electrically connect serial components of electronic or electrochemical systems, for example battery electrodes inside battery cells or supercapacitors.

Much of the knowledge presently available on the practical use of ECAs has been obtained with isotropic conductive epoxy adhesives (ICAs) filled with Ag. Cyanate, silicone and polyurethane esters are also commonly used as thermosetting resins alternative to epoxy resins, while nickel (Ni) and Cu are electrically conductive fillers the use of which is well established. However, oxidation of these metals results in the loss of their initial electrical performance. Furthermore, metal-ion migration in the materials making up the solar cells determines the formation of sites of filler recombination as well as the deterioration of the solar cell structure, reducing the overall performance of the ECA for use in solar cells.

US 20120145315 describes a production process for forming an anisotropic conductive polymeric body comprising conductive particle pathways in the polymer matrix. In one embodiment, the matrix can be an adhesive for connecting the ribbons of a solar cell to a busbar. In particular, the conductive particles can be in the form of spherical carbon black (CB) particles or disk-like or conical carbon nanoparticles. A significant feature of the described composition is a concentration of conductive fillers in the range of 0.1 to 10% by volume. The matrix polymer used is a polymer curable by ultraviolet (UV) radiation and the anisotropic adhesive is obtained by applying an electric field.

WO2018/013342 describes electrically conductive adhesives with improved bonding strength to the surface of solar cell electrodes. The described adhesive comprises at least one peroxide-curable elastomer and at least one peroxide-based curing agent. Conductive particles can generally be selected from metal and non-metal particles, including carbon nanotubes, graphene and their combinations.

The tests described are limited to adhesives comprising Ag flakes.

CN 108384103 describes a conductive composite material comprising graphene, carbon nanotubes and carbon black as conductive components, in a specific formulation which also contains epoxy resin, hydroxyl acrylic resin, a curing agent, aniline, nanosilicon powder, white mineral oil, zirconium hydrogen phosphate, an emulsion of butyl acrylate, N-methylpyrrolidone, polytetrafluoroethylene, an emulsion of polyvinylidene chloride, sodium dodecyl sulfate, ethylene-vinyl acetate copolymer and significant quantities of iron salts ($FeSO_4.7H_2O$, $FeCL_3.6H_2O$). This document reports electrical conductivities greater than $10^{-2}$ S $m^{-1}$ for the optimal cases wherein the fraction by weight of graphene is greater than 5%; an upper limit for electrical conductivity is not reported, while the lower limit is lower by about six orders of magnitude with respect to the conductivity values obtained with the adhesives of the present invention (in the order of 1000 S $m^{-1}$). The reproduction of example 3 of the cited document, shown in the comparative example that follows, has shown that the composite material obtained with such formulation is in a wet solid form and consists of separate lumps that make such material difficult to process with the deposition methods described below for the adhesive compositions of the present invention. Furthermore, the resistivity of the composite material obtained from example 3 was found to be 3.99 Ωcm, which is greater by about two orders of magnitude with respect to that obtained with compositions according to the present invention using the same polymer adhesive agent (EVA).

In the field of manufacture of next generation photovoltaic devices, furthermore, there is the need, not yet met, for metal-free electrically conductive adhesives having improved electrical performance and enhanced reliability.

SUMMARY OF THE INVENTION

The object of the present invention is to provide an electrically conductive adhesive composition, which does not comprise conductive metal fillers in the elemental or ion form (salts) and which, nevertheless, has optimal features in terms of conductivity, process temperature and adhesion, suitable for the above mentioned uses so as to replace conventional electro-conductive adhesives based on metal fillers such as Cu and Ag, or as an exclusive choice for PSCs (impossibility of processing ECAs at temperatures greater than 100/120° C., i.e. above temperatures compatible with the thermochemical stability of perovskites, according to their formulation).

To this end, an object of the invention is an electrically conductive adhesive composition, which is free of metals and metal salts, as defined by the following claims.

Another object of the invention is a process for the preparation of the above mentioned adhesive composition.

Further objects of the invention relate to the use of the adhesive composition for the connection of the Sn-coated Cu ribbon to a busbar and for the production of back-electrodes in perovskite solar cells.

Further features and advantages of the invention will become clear from the following description, made with reference to the accompanying drawings.

BRIEF DESCRIPTION OF THE DRAWINGS

In the accompanying drawings:

FIG. 2a, normalized resistance as a function of tensile deformation for adhesives C-EVA-ECA-4 and C-EVA-ECA-5 (according to the invention) compared with a commercial Ag-based composition (Henkel) and with comparative compositions and C-EVA-ECA-3;

FIG. 2b, normalized resistance as a function of tensile deformation for the C-EVA-ECA-3 (comparative) adhesive with the abscissa scale extended up to 335% tensile deformation (fracture point);

DETAILED DESCRIPTION OF THE INVENTION

A first aspect of the present invention relates to a metal-free ECA composition, in the form of a curable paste or ink, comprising an adhesive polymer component and an electrically conductive carbon-based component, characterized by components having different topological morphologies.

In a preferred embodiment, the ECA composition is a paste which is processable at low temperature, lower than 100° C. including room temperature, where the term "processable" indicates the possibility of application by means of doctor blading or spin coating.

As the adhesive polymer component, a polymer may be used, which is known as a solar cell encapsulant. The polymer component can be selected from polyethylene-vinyl acetate (EVA), polyolefin elastomers (POEs), polyvinyl butyral (PVB), poly(acrylic acid) (PAA), (methyl methacrylate)(PMMA) and polyacrylates or commercial polyacrylate mixtures (e.g. Hydrolac 610L, polyacrylate water dispersion).

The polymer component is preferably an EVA copolymer, obtained by the copolymerization of ethylene with vinyl acetate, with a vinyl acetate content of 5 to 50% by weight, preferably 15 to 45% by weight. Commercial copolymers such as for example ELVAX® from DuPont, whose commercial grades have a vinyl acetate content generally of 9 to 40% by weight, can be used.

The POEs used within the scope of the invention comprise ethylene copolymers with various monomers such as propylene, butene, hexane and octene. In practice, ethylene-octene and ethylene-butene are commercial products that exhibit excellent elasticity, dielectric properties and easy processability. POEs can be combined with different polymers, including polyethylene, polypropylene and polyamide in order to modulate the material properties. Examples of commercial POEs comprise PHOTOCAP® 35521P HLT (STR), ENGAGE™ (Dow Chemical) and TAFMER™ (Mitsui Chemicals).

EVA and POE polymers can be specifically optimized with additives (for example metal peroxides) so as to adjust their melting point and/or their cross-linking temperature.

Adhesion of EVA and POE polymers to silicon and metal (including Ag and Cu) surfaces, mechanical elasticity and excellent mechanical and thermal fatigue resistance, are well known in the art and make these materials a technological standard as encapsulants in the PV field.

The carbon-based electro-conductive component is a mixture comprising at least 0D acetylene black (or carbon black)nanoparticles, 1D carbon nanotubes and 2D flakes or plates (platelets) of graphene or graphene derivatives. Graphene flakes are preferably obtained by means of the wet-jet milling exfoliation process in solvents described in WO2017089987 to the Applicant. Graphene derivatives comprise reduced graphene oxide.

The invention is based on the experimental acknowledgement that the use in the adhesive composition object of the invention of a mixture of the three above mentioned carbon-based fillers involves a substantial reduction in volumetric resistivity, reaching values which allow the use of the adhesive composition instead of conventional metal filler-based electrically conductive adhesive compositions.

According to the invention, the electro-conductive component comprises:
- acetylene black or carbon black particles from 15 to 45% by weight, preferably from 35 to 45% by weight,
- carbon nanotubes from 5 to 25% by weight, preferably from 10% to 20% by weight,
- flakes or plates of graphene or graphene derivatives from 35 to 70% by weight, preferably graphene flakes from 35 to 45% by weight, the above mentioned percentages being referred to 100 parts by weight of the conductive component.

The combination of carbon nanomaterials with different topological morphologies significantly increases electrical performance compared to the use of single carbon nanomaterials; thus, the electrical conductivity of the ECAs object of the invention can be adjusted by varying the weight ratio of the carbon nanomaterials.

Although the explanation of the mechanism is not binding for the scope of the invention, flakes of graphene/graphene derivatives are believed to provide excellent conductivity as far as flakes of graphene/graphene derivatives are concerned. Acetylene black nanoparticles fill the voids between the flakes of graphene/graphene derivatives that are electrically connected. Carbon nanotubes create highly conductive pathways that connect compact conductive domains formed by acetylene black nanoparticles and graphene flakes.

In the paste adhesive, the percentage by weight of the polymer component and of the conductive component as compared to the solid content can vary according to the final use of the ECAs, in accordance with the following data:
- polymer adhesive component 5-40% by weight,
- electrically conductive component 60-95% by weight.

Experimentally, the mechanical properties, such as tensile strength and elongation at break, improve as the percentage by weight of the adhesive component increases. However, an excess content of the adhesive component results in low electrical conductivity (conductivity <10 S m$^{-1}$). The preferred content of adhesive component for the formulation of a paste with high electrical conductivity ranges from 20 to 30% by weight, more preferably 25% by weight. This value results in an excellent electrical connection of carbon nanomaterials.

With reference to mechanical properties, the specific mechanical properties of flakes of graphene/graphene derivatives and carbon nanotubes allow the ECA to be mechanically strengthened. In addition, the excellent thermal conductivity of graphene/graphene derivatives and carbon nanotubes allows effective heat dissipation, improving the reliability of ECAs in electrical and thermal durability tests. In particular, the synergistic combination of nanomaterials allows to obtain greater electrical performance (volumetric resistivity lower than $10^{-1}$ Ωcm) than that obtained with the individual carbon components (volumetric resistivity greater than 10 Ωcm for graphene- and acetylene black-based ECAs; volumetric resistivity $>10^{-1}$ cm for single-walled carbon nanotubes). The compositions object of the invention thus allow to avoid the use of precious metals such as Ag and Au as conductive material, reducing the overall cost of the ECA.

Another aspect of the invention relates to the process for the preparation of the above described ECAs comprising the following steps:
i) providing an adhesive component by melting, at a temperature preferably in the range from 120 to 180° C., a polymer selected from EVA, POE, PVB, PAA, PMMA, polyacrylates and dissolving or dispersing said polymer (or mixture of polymers) in a compatible solvent, preferably selected from chlorobenzene, chloroform, xylene, isopranol and their mixtures;
ii) providing an electrically conductive component by mixing the powders of carbon nanomaterials comprising acetylene or carbon black nanoparticles, carbon nanotubes and flakes or plates of graphene or graphene derivatives, in the above mentioned proportions;
iii) homogeneously mixing the adhesive and electrically conductive components by mechanical stirring at a temperature ranging from 40 to 60° C., to obtain a paste (slurry);
iv) depositing the obtained paste, by means of process techniques in solution, optionally compatible with low temperatures (preferably <100° C., including room temperature), thus obtaining the ECA composition.

"Compatible solvent" herein means a solvent capable of dissolving or dispersing the polymer component, without causing aggregation phenomena.

In step i), the adhesive component is advantageously formulated in highly volatile organic solvents (i.e. having a high vapor pressure, preferably greater than about 0.8 kPa, and preferably with low process temperatures (<100° C., including room temperature (25° C.)), particularly chlorobenzene, xylene and isopranol, whose vapor pressures at 25° C. are: ~1.6 kPa for chlorobenzene, 1.1 kPa for m-xylene, ~0.88 for o-xylene, ~1.16 kPa for p-xylene, 5.8 kPa for isopranol.

Further solvents that may be used within the scope of the invention are reported in the claims and in the following experimental section.

The solvents cited are also intended to include water solutions of such solvents, when compatible with the polymer component. Water can be used as a solvent or dispersant, or as a component of a solvent mixture, for example with polymer alcohols having sufficient water solubility. Such polymers mainly belong to the class of acrylates.

The amount of solvent in the paste adhesive generally is comprised between 50 and 90% by weight referred to 100 parts by weight of the ECA (solvent included).

Thanks to the use of highly volatile solvents in the preparation process, the herein described ECAs can be processed (i.e. deposited/applied) and cured at low temperature (<100° C.), including room temperature (25° C.). This avoids the high temperature treatment of pastes which is a pre-requisite for the applicability of traditional welding (welding temperature greater than 180° C. for Sn—Pb welding) and for commercially available ECA pastes (curing temperature typically >100° C.).

The ECAs object of the invention can be advantageously applied to thermally sensitive substrates including various plastic materials and semiconductors of solar cells.

It is also an object of the invention the use of the ECAs object of the invention for the connection of Cu ribbon, conventionally coated with Sn, to Ag busbars in HTJ-Si, whose ribbon application process is not compatible with traditional welding.

In these applications, mechanical adhesion and the quality of the electrical contact between the Ag busbar/ECA/Cu ribbon was assessed before and after mechanical, thermal and electrical stress, based on standard resistance tests reported in the IS/IEC 61730.2 and IEC 61215 standards.

The performance of the ECAs object of the invention for the process for applying the conductive ribbon in HJT-Si cells was comparable to that obtained by conventional Ag-filled ECAs. Another object of the invention is the use of the ECA pastes described herein for the production of carbon-based back-electrodes with a surface resistance of less than 200Ω sq$^{-1}$ for a thickness of less than 10 μm. The ECAs were deposited on PSC perovskite-based films using liquid-phase process techniques (e.g. spin-coating) at room temperature. Multiple deposition cycles were effective for the production of back-electrodes with a surface resistance of less than 500Ω sq$^{-1}$, exceeding the values exhibited by TCO-based back-electrodes (used for example in HJT-Si or double-side PSC technologies).

Example 1: ECA with EVA Adhesive Component or Elastomer Polyolefines

In the tests that follow and in the following examples, the following materials were used for the conductive component:
- acetylene black nanoparticles (Sigma Aldrich), particle size: 24 nm,
- carbon nanotubes purchased from Cheap Tubes (single-walled carbon tubes, outer diameter: 1-4 nm, inner diameter: 0.8-1.6 nm, length: 5-30 μm);
- graphene flake powder isolated by drying a flake dispersion obtained by means of graphite wet-jet milling exfoliation in N-methyl-2-pyrrolidone in accordance with WO2017/089987;
- commercial graphene nanoplates purchased from Sigma Aldrich and reduced graphene oxide powders (Sigma Aldrich).

In example 1, the following polymers were used:
EVA: commercial product ELVAX®, Du Pont (40% by weight of vinyl acetate) elastomer polyolefins: commercial product PHOTOCAP® 35521P HLT, STR.

In all the prepared samples, a percentage of 25% by weight of the adhesive component was used. The adhesive components were previously melted at 150° C. for EVA or 180° C. for polyolefin and dissolved in chlorobenzene or in a mixture of xylene isomers having the above mentioned vapor pressures; 6 mL of solvent were used for 1 g of solid polymer component The exemplified ECA compositions have a content of polymer component of 25% by weight referred to 100 parts of polymer component and conductive component.

The ECAs were obtained by depositing the corresponding paste (slurry) by means of a doctor blade and subsequent drying of such pastes at 50° C. for 10 minutes. The thickness of the resulting ECAs is between 25 and 45 μm depending on the ECA formulation, measured by means of an optical profilometer.

Table 1 shows the percentages by weight of each carbon nanomaterial, the average volumetric resistivity and the error (standard deviation) for each ECA tested. The EVA- and POE-based ECAs are respectively called C-EVA-ECA-X and C-polyolefin-ECA-X, where X indicates different compositions of electro-conductive component and/or solvent.

The compositions indicated with an asterisk are shown by way of comparison.

TABLE 1

Composition of the electro-conductive component and volumetric resistivity for representative ECA samples (percentage by weight of the adhesive component = 25%).

| ECA | Acetylene black (% wt) | Carbon nanotubes (% wt) | Graphene flakes (% wt) | Graphene nanoplates (% wt) | Reduced graphene oxide (% wt) | Solvent | Average volumetric resistivity (Ω cm) | Error (Ω cm) |
|---|---|---|---|---|---|---|---|---|
| *C-EVA-ECA-1 | 100 | 0 | 0 | 0 | 0 | Chlorobenzene | 5.143 | 1.061 |
| *C-EVA-ECA-2 | 0 | 0 | 100 | 0 | 0 | Chlorobenzene | 8.525 | 12.838 |
| *C-EVA-ECA-3 | 20 | 0 | 80 | 0 | 0 | Chlorobenzene | 0.794 | 0.090 |

TABLE 1-continued

Composition of the electro-conductive component and volumetric resistivity for representative
ECA samples (percentage by weight of the adhesive component = 25%).

| ECA | Acetylene black (% wt) | Carbon nanotubes (% wt) | Graphene flakes (% wt) | Graphene nanoplates (% wt) | Reduced graphene oxide (% wt) | Solvent | Average volumetric resistivity ($\Omega$ cm) | Error ($\Omega$ cm) |
|---|---|---|---|---|---|---|---|---|
| C-EVA-ECA-4 | 42.5 | 15 | 42.5 | 0 | 0 | Chlorobenzene | 0.068 | 0.007 |
| C-EVA-ECA-4B | 42.5 | 15 | 42.5 | 0 | 0 | Xylene | 0.146 | 0.038 |
| C-polyolefin-ECA-4 | 42.5 | 15 | 42.5 | 0 | 0 | Chlorobenzene | 1.397 | 0.504 |
| C-EVA-ECA-5 | 17 | 15 | 68 | 0 | 0 | Chlorobenzene | 0.098 | 0.015 |
| C-EVA-ECA-5B | 17 | 15 | 68 | 0 | 0 | Xylene | 0.379 | 0.046 |
| C-polyolefin-ECA-5 | 17 | 15 | 68 | 0 | 0 | Chlorobenzene | 1.232 | 0.262 |
| C-EVA-ECA-6 | 42.5 | 15 | 0 | 42.5 | 0 | Chlorobenzene | 0.369 | 0.061 |
| C-EVA-ECA-7 | 17 | 15 | 0 | 68 | 0 | Chlorobenzene | 0.129 | 0.013 |
| C-EVA-ECA-8 | 42.5 | 15 | 0 | 0 | 42.5 | Chlorobenzene | 0.268 | 0.039 |
| C-EVA-ECA-9 | 17 | 15 | 0 | 0 | 68 | Chlorobenzene | 0.191 | 0.050 |

*comparative

The combination of acetylene black, carbon nanotubes and graphene flakes (produced by wet-jet milling) in the electro-conductive component, in the compositions according to the invention, is effective in reducing the volumetric resistivity to values lower than $10^{-1}$ $\Omega$cm for the preferred compositions C-ECA-4 and C-ECA-5 which use EVA polymer and a chlorobenzene solvent as compared to the corresponding comparative compositions.

The volumetric resistivity of C-EVA-ECA-4 is comparable with that measured for commercially available Ag-based ECAs from Henkel (i.e. 0.055±0.007 $\Omega$cm).

The polyolefin-based ECAs as the adhesive component show greater volumetric resistivity compared to EVA-based ones having the same composition of the electrically conductive component; however, the experimental tests have also shown for these compositions a reduction in resistivity compared to corresponding compositions having a single carbon-filler morphology or including two filler morphologies.

Perspectively, the optimization of the C-polyolefin-ECA composition can further reduce the volume resistivities obtained.

The experimental data confirm the use of chlorobenzene as the preferred solvent for the exemplified polymer components.

Figure 1:
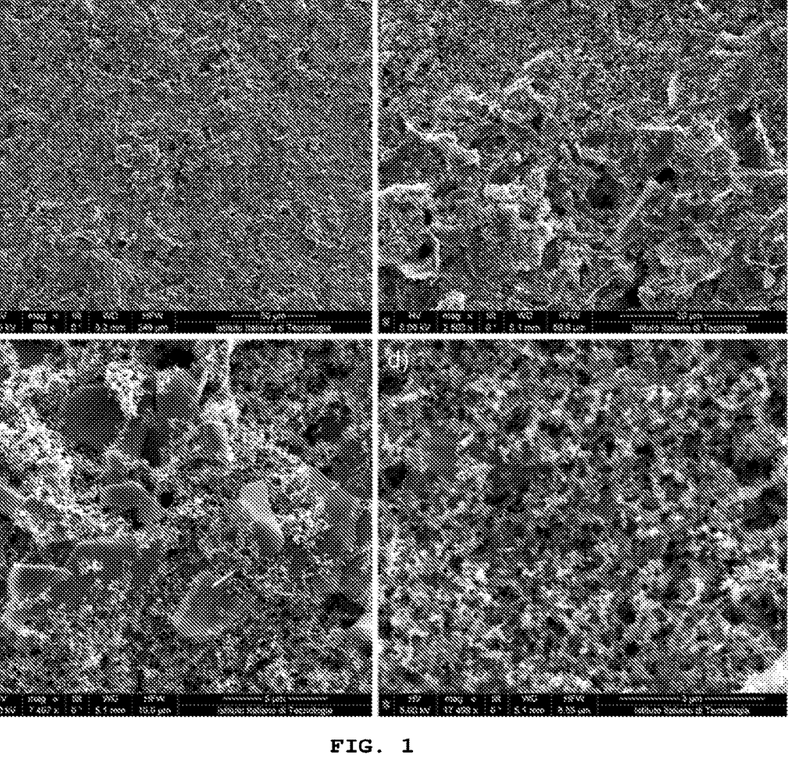
FIG. 1 illustrates images obtained with a scanning electron microscope of an adhesive composition according to the invention (C-EVA-ECA-4) with increasing magnification from panel a) to panel d)

SEM analysis (FIG. 1) shows that the C-ECA-EVA-4 composition, which is the sample with the best electrical conductivity among those reported, consists of a lattice structure of graphene flakes filled with acetylene black nanoparticles. The conductive lattice structure is electrically connected by filling the voids among the highly conductive graphene flakes. Carbon nanotubes are not resolved due to their nanometric size. However, they are expected to provide electrical connections among multiple carbon nanomaterials. The EVA polymer acts as a bonding component to mechanically bond the entire film structure.

Example 2: Product Reliability

Figure 2:
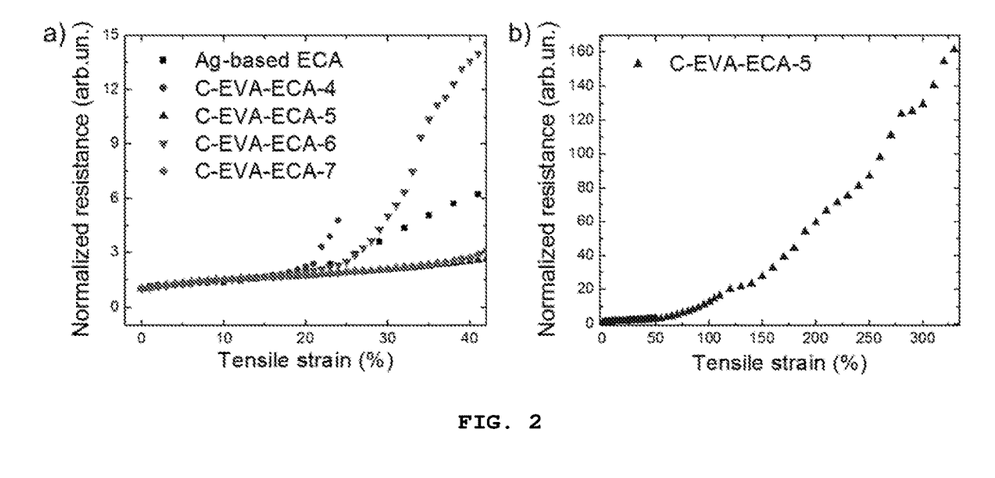
FIG. 2 illustrates electrical resistance diagrams as a function of the tensile deformation for different adhesive compositions.

In order to test the reliability of the C-EVA-ECAs object of the invention, their electrical resistances were measured depending on the deformation applied. The results shown in FIG. 2 indicate that the C-EVA-ECA compositions have a behavior similar to that of commercially available Ag-based ECAs (Henkel), upon a tensile deformation of up to 20%. At tensile deformation values greater than 20%, the C-EVA-ECA compositions with greater percentage by weight of graphene (C-EVA-ECA-5) show an optimal retention of the initial electrical resistance, which is also greater than that obtained for Ag-based ECAs.

Figure 3:
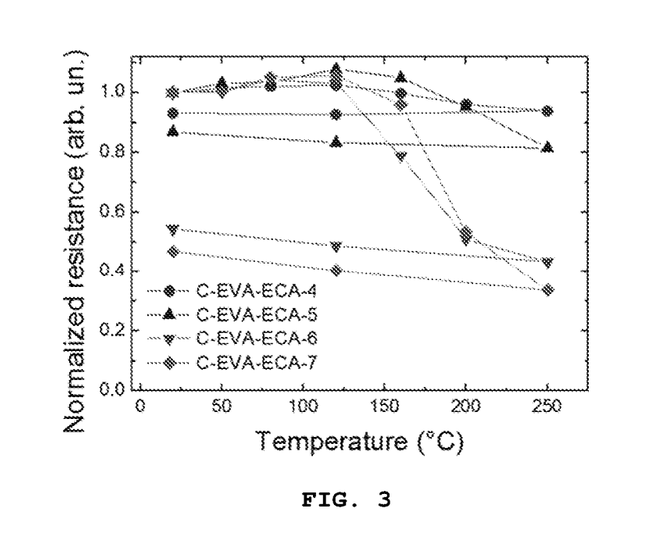
FIG. 3 illustrates the results of electrical resistance as a function of temperature for the adhesive compositions of FIG. 2.

The reliability of C-EVA-ECAs was also tested by thermal stress. FIG. 3 illustrates the electrical resistances of the same compositions illustrated in FIG. 2 as a function of temperature. The temperature is varied from 20° C. (room temperature) to 250° C. For each resistance sampling point as a function of temperature, the temperature is kept constant for 5 minutes. The increase time between different temperatures tested is 5 minutes. After reaching 250° C., the temperature is allowed to cool down to room temperature. The results indicate that the C-EVA-ECA compositions maintain their initial electrical resistance up to a temperature of 120° C. Above this temperature, the electrical resistance decreases as the temperature increases. This effect should be deemed caused by the cross-linking of EVA at temperatures greater than 160° C. In fact, the changes in electrical resistance are then partially maintained when the samples are cooled to room temperature. The standard lamination temperature of PV modules (between 145 and 160° C.) improves the final electrical performance.

Overall, the C-EVA-ECA compositions show reliable electrical performance under mechanical and thermal stress which can also reach values greater than those of the practical operating condition of C-EVA-ECA in electrical devices, including solar cells.

Example 3: Validation of HJT-Si Solar Cells

Figure 4:
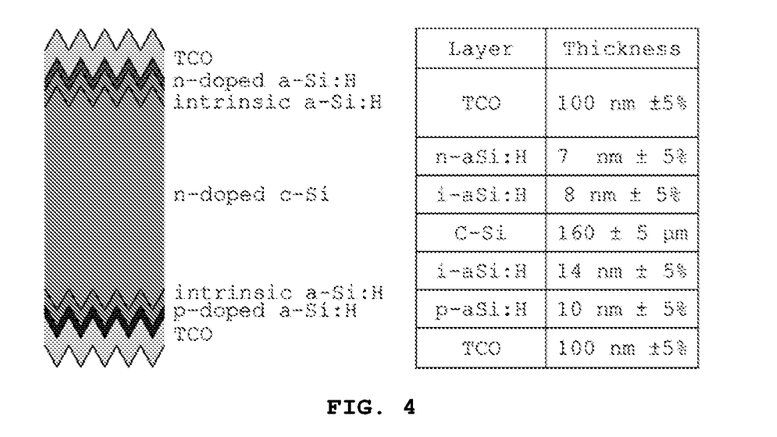
FIG. 4 is a schematic representation of the layered structure of a HJT-Si solar cell.

The C-EVA-ECA-5 composition was validated as a composition suitable for the application process of metal ribbons to metal contact grids (ribbon tabbing) for the serial connection of HJT-Si solar cells. Tests were carried out with the use of C-EVA-ECA-5 due to its excellent mechanical and electrical properties (see examples 1-3). FIG. 4 shows the HJT-Si structure used for the tests. The table alongside the figure also shows the thicknesses of the layers of the HUT-Si structure.

Figure 5:
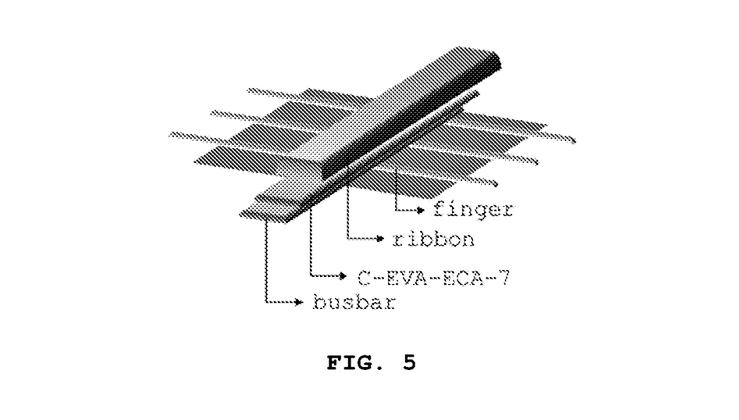
FIG. 5 is a schematic representation of a ribbon/busbar connection in a HJT/Si solar cell.

The metal contact grids are deposited by silkscreen printing on the front and rear of the HJT-Si. Such grids consist of rectangular strips (busbars) perpendicular to "super-thin" grid fingers. Sn-coated Cu strips are used as ribbons. These ribbons are connected to the busbar by C-EVA-ECA-5. FIG. 5 illustrates a diagram of the ribbon/busbar connection by means of the aforementioned adhesive composition.

The quality of the electrical contact is assessed by measuring the electrical resistance between the non-contacting part of the busbar and the floating part of the ribbon (contact resistance). The busbar/ribbon contact area is 0.3 cm×1 cm. The contact resistance obtained using C-EVA-ECA-5 is 0.219Ω. This value is better than that obtained using commercially available Ag-based ECAs (0.295Ω). In order to determine the mechanical and electrical reliability of the contact, the same measurement is performed after encapsulation of the busbar/ribbon contact area with EVA. Following traditional encapsulation with EVA, the contact resistance obtained with C-EVA-ECA-5 is 0.293Ω. Again, this value is lower than that of the contact resistance measured using Ag-based ECAs (0.351Ω).

Busbar/ribbon contact resistance tests are carried out by measuring the contact resistance at different applied currents.

Figure 6:
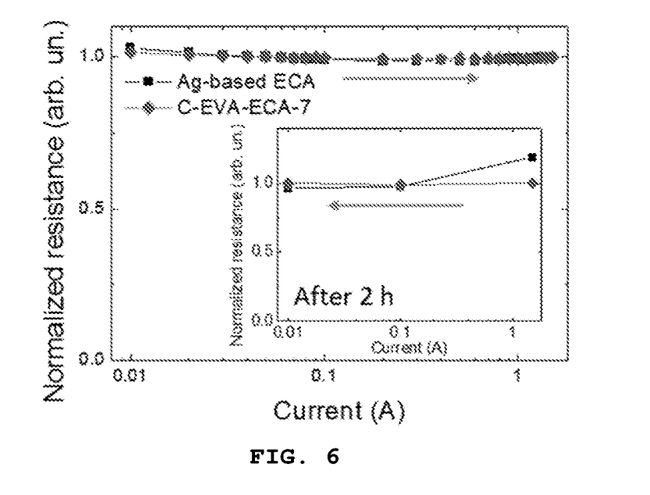
FIG. 6 is a diagram illustrating the electrical contact resistance, as a function of the current applied for a sample of commercial silver-based adhesive (Henkel) and for the C-EVA-ECA-5 composition, according to the invention.

FIG. 6 illustrates the normalized contact resistances obtained using Ag-based ECAs and C-EVA-ECA-5 as a function of the applied current, starting from 0.01 A and increasing up to 1.5 A. The insert illustrates the results obtained after two hours at an applied current of 1.5 A, starting from such applied current and reducing the applied current to 0.01 A.

It should be noted that the maximum normalized applied current on the contact area is comparable or greater than those used for the hot-spot resistance test of solar cells reported in IEC 61730.2 (MQT 09) (minimum current tested 1.25 times greater than the short-circuit current of the entire solar cells). The purpose of this test is to determine the module's capability of withstanding hot-spot heating effects, i.e. melting of solder or encapsulation deterioration. This defect could be caused by defective cells, misaligned cells, shadowing or fouling. Since the absolute temperature and the relative performance losses are not criteria for this test, the most severe hot-spot conditions are used (corresponding to a minimum current 1.25 times greater than that of the short-circuit current of the entire solar cells), to ensure the reliability of the project. In fact, hot-spot heating takes place in a module when its operating current exceeds the reduced short-circuit current of a shaded or defective cell or groups of cells. When this condition occurs, the cell (or group of cells) affected thereby is forced with reverse polarization and must dissipate energy, causing overheating. If the energy dissipation is sufficiently high or sufficiently localized, the cell with reverse polarization can overheat, resulting, depending on the technology, in melting of solder, deterioration of the encapsulant of the front and/or back cover, breakage of the substrate superstrate and/or glass cover. Herein, ideal ECAs must show reliable mechanical and electrical contact by providing both thermal fatigue resistance and suitable heat dissipation. The results of FIG. 6 indicate that, similarly to the contact resistance obtained using Ag-based ECAs, the contact resistance obtained using C-EVA-ECA according to the invention has excellent holding as the applied current increases. After two hours, at an applied current of 1.5 A, the contact resistance obtained using Ag-based ECAs increases by about 20%, while the contact resistance obtained using C-EVA-ECA-5 is maintained. After reducing again the applied current to 0.01 A, both contact resistances show values similar to those measured at the beginning of the test.

The contact reliability in withstanding thermal variance, fatigue and other stresses caused by temperature changes is determined by measuring the contact resistance at representative temperatures. In more detail, the temperature is varied from 20° C. (room) to 100° C. After reaching 250° C., the temperature is allowed to drop to room temperature. The contact resistance is therefore measured at the temperature of −70° C. It should be noted that the upper and lower temperature limits are greater and lower than those used during the thermal cycling test (MQT 11) reported in IEC 61215, whose purpose is to determine the module's capability of withstanding thermal variance, fatigue and other stresses caused by repeated temperature changes. The contact resistance obtained using C-EVA-ECA drops from 0.293Ω to 0.257Ω. By cooling the contact to room temperature, the contact resistance is 0.2477Ω. After cooling the contact to −70° C., the electrical resistance decreases from 0.2477Ω to 0.1933Ω. After the contact returns to room temperature, the contact resistance increases to 0.2441Ω. This value is comparable to that measured at room temperature in the initial stage of the tests. Overall, resistance tests indicate that the C-EVA-ECA composition maintains its electrical performance under electrical or thermal stress.

Example 4: Validation of PSCs

The C-EVA-ECA-4 composition is deposited on active films of mesoscopic PSCs to provide cost-effective carbon-based back-electrodes obtained through a liquid-phase process at room temperature. According to previous reports (Najafi et al. in ACS Nano, 2018, 12(11), pages 10736-10754) architectures made from fluoride-doped tin oxide (FTO)/compact $TiO_2$ ($cTiO_2$)/mesoporous $TiO_2$ ($mTiO_2$)/ $CH_3NH_3PbI_3$/2,2',7,7'-tetrakis(N,N-di-4-methoxyphenylamino)-9,9'-spirobifluorene (spiro-OMeTAD) are used as benchmarking PSCs not completed by Au-based back-electrodes. The $TiO_2$ layers perform a selective extraction and transport function of the negative charge photo-generated by perovskite (in our case $CH_3NH_3PbI_3$), and form the so-called electron transporting layer (ETL). The spiro- OMeTAD performs a selective extraction and transport function of the positive charge photo-generated by perovskite, and forms the so-called hole transporting layer (HTL). The concentration of the active materials (electrically conductive and adhesive components) of C-EVA-ECA-4 is adjusted to 111 mg m$^{-1}$ in order to provide suitable viscosity for the spin-coating process.

Figure 7:
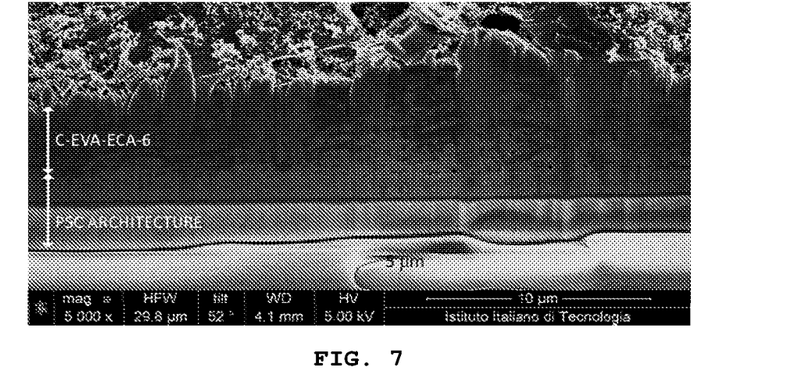
FIG. 7 is an image of the cross section of a PSC having a back-electrode based on the adhesive according to the invention.

The deposition of C-EVA-ECA-4 on CH$_3$NH$_3$PbI$_3$/spiro-OMeTAD is carried out by deposition via dynamic spin-coating at room temperature with a two-stage protocol (stage 1: 1000 rpm, 3 min.; stage 2: 4000 rpm, 3 min.). As illustrated by the cross-sectional SEM image of FIG. 7, the deposition of C-EVA-ECA-4 does not significantly deteriorate the underlying layered structure. However, an interpenetration of C-EVA-ECA within the spiro-OMeTAD is to be expected, as the C-EVA-ECA solvent can dissolve the spiro-OMeTAD. Operationally, the efficiencies of C-EVA-ECA-based PSCs can be increased by subsequent deposition of spiro-OMeTAD over the C-EVA-ECA. In addition, mixtures of spiro-OMeTAD and C-EVA-ECA can be used to deposit an ECA with a dual HTL and electrode function.

Finally, materials with the function of HTL alternative to the spiro-OMeTAD and not dissolvable in the C-EVA-ECA solvent can be used to avoid interpenetration of the C-EVA-ECA in the underlying structure of the solar cell. Alternatively, other ECAs object of the invention and discussed in example 7 can be used to avoid the use of solvents dissolving the materials with the HTL function.

No heat treatment is applied to the C-EVA-ECA-4-based PSC.

The resulting C-EVA-ECA-4-based back-electrodes have a surface resistance of 155±20 ΩSQ$^{-1}$ for a thickness of less than 10 μm. Multiple deposition cycles are effective for the production of C-EVA-ECA-4-based back-electrodes with surface resistances of less than 50Ω sq$^{-1}$, exceeding the values often obtained by TCO-based back-electrodes used for example in HJT-Si or double-side PSC technologies.

Example 5: Validation of Batteries and Supercapacitors

The C-EVA-ECA-4 and C-EVA-ECA-5 compositions were used for the mechanical and electrical connection of electrodes in series of battery cells and supercapacitors, ensuring total reliability of the electrical contact of electrodes in series with electrical resistances lower than 0.1Ω on contact areas equal to or greater than 1 cm×1 cm and C-EVA-ECA thicknesses between 1 and 400 μm. The reliability of the mechanical and electrical contacts of electrodes in series is ensured by an even distribution of the compression forces acting on the electrodes themselves, deriving from the elastic properties of C-EVA-ECAs.

Example 6: ECAs with an EVA Adhesive Component with Different Vinyl Acetate Content According to the procedure of example 1, ECA compositions were prepared using EVA polymers with different vinyl acetate content. In particular, the following EVA copolymers were used:
EVA with 40% by weight vinyl acetate (Sigma Aldrich) called EVA-B;
EVA with 25% by weight vinyl acetate (Sigma Aldrich) called EVA-C;
EVA with 18% by weight vinyl acetate (Sigma Aldrich) called EVA-D;
EVA with 12% by weight vinyl acetate (Sigma Aldrich) called EVA-E.

The main features of some of the ECAs thus prepared (composition of the electro-conductive component, solvent, volumetric resistivity) are reported in table 2 below.

TABLE 2

Composition of the electro-conductive component and volumetric resistivity for representative EVA-based ECA samples with different vinyl acetate content (percentage by weight of the adhesive component = 25%).

| ECA | Acetylene black (% wt) | Carbon nanotubes (% wt) | Graphene flakes (% wt) | Solvent | Volumetric resistivity (Ω cm) | Error (Ω cm) |
|---|---|---|---|---|---|---|
| C-EVA-B-ECA | 42.5 | 15 | 42.5 | Chlorobenzene | 0.124 | 0.012 |
| C-EVA-C-ECA | 42.5 | 15 | 42.5 | Chlorobenzene | 0.144 | 0.017 |
| C-EVA-D-ECA | 42.5 | 15 | 42.5 | Chlorobenzene | 0.255 | 0.020 |

Example 7: ECAs with Different Polymer Components and Solvents

In addition to the polymers used in the tests of example 1, other polymers were used, reported as encapsulating materials, following the procedure described in example 1. Specifically, polyvinyl butyral (PVB), poly(acrylic acid) (PAA), poly(methyl methacrylate) (PMMA) and commercial acrylate mixtures (Hydrolac 610L, material supplied in the form of an aqueous dispersion) were used. Herein, other solvents were also used in addition to chlorobenzene and xylene, capable of properly dissolving or dispersing the polymers used.

In particular, the following solvents were used:
for PVB, acetic acid and other solvents with lower volatility such as cyclohexanone, butanol, dimethylformamide (DMF), N-methyl-2-pyrrolidone (NMP), dimethylsulfoxide (DMSO). For these tests, the ECAs produced by doctor-blade deposition were dried at 50° C. for 60 minutes;
for PMMA, nitroethane, toluene, chloroform, ethyl acetate, chlorobenzene and cyclohexanone (solvent with less volatility); the ECAs produced by doctor-blade deposition were dried at 50° C. for 60 minutes;
for PAA, isopropanol (IPA) and ethanol;
for commercial acrylate mixtures, water.

Table 3 below shows the main features of the above mentioned ECAs, wherein the electrically conductive component composition corresponding to that of the C-EVA-ECA-4 (or C-EVA-ECA-4B or C-polyolefin-ECA-4) products was used.

TABLE 3

Composition of electrically conductive component and volumetric resistivity for ECAs using different adhesive polymer components and solvents in addition to chlorobenzene (percentage by weight of adhesive polymer component = 25%).

| ECA | Acetylene black (% wt) | Carbon nanotubes (% wt) | Graphene flakes (% wt) | Solvent | Volumetric resistivity ($\Omega$ cm) | Error ($\Omega$ cm) |
|---|---|---|---|---|---|---|
| C-PVB-ECA-1 | 42.5 | 15 | 42.5 | Acetic acid | 0.174 | 0.023 |
| C-PVB-ECA-2 | 42.5 | 15 | 42.5 | Butanol | 0.385 | 0.041 |
| C-PVB-ECA-3 | 42.5 | 15 | 42.5 | Cyclohexanone | 0.338 | 0.055 |
| C-PVB-ECA-4 | 42.5 | 15 | 42.5 | DMSO | 0.230 | 0.046 |
| C-PVB-ECA-5 | 42.5 | 15 | 42.5 | DMF | 0.091 | 0.009 |
| C-PVB-ECA-6 | 42.5 | 15 | 42.5 | NMP | 0.074 | 0.013 |
| C-PMMA-ECA-1 | 42.5 | 15 | 42.5 | Ethyl acetate | 0.132 | 0.031 |
| C-PMMA-ECA-2 | 42.5 | 15 | 42.5 | Nitroethane | 0.092 | 0.009 |
| C-PMMA-ECA-3 | 42.5 | 15 | 42.5 | Toluene | 0.253 | 0.032 |
| C-PMMA-ECA-4 | 42.5 | 15 | 42.5 | Chloroform | 0.201 | 0.030 |
| C-PMMA-ECA-5 | 42.5 | 15 | 42.5 | Chlorobenzene | 0.657 | 0.091 |
| C-PMMA-6 | 42.5 | 15 | 42.5 | Cyclohexanone | 0.429 | 0.065 |
| C-PAA-ECA-1 | 42.5 | 15 | 42.5 | IPA | 0.061 | 0.007 |
| C-PAA-ECA-2 | 42.5 | 15 | 42.5 | Ethanol | 0.015 | 0.004 |
| C-acrylate mixture-ECA | 42.5 | 15 | 42.5 | Water | 0.045 | 0.009 |

Example 8: Adhesive Compositions with Different Solvents and Process Restrictions Although the solvents used for the ECAs shown in example 1, table and for example 7, table 3, can generally be used for the formulation of the ECAs according to the procedures given in example 1, they can impose limitations in relation to the methods used for processing (i.e. depositing/applying) the ECAs. Depending on the properties of the solvents used, it is suggested that the resulting ECAs are processed at low temperature (<100° C.) with the techniques shown in table 4 below. Furthermore, other techniques such as gravure and flexographic printing can be used within the scope of the invention; the use of other deposition parameters, such as substrate temperature and paste temperature, other than those indicated in the notes relating to table 4 also falls within the scope of the invention.

TABLE 4

Preferred process methods for ECAs depending on the solvent

| ECA's solvent | Doctor blading[a] | Spin coating[b] | Spray coating[c] | Screen printing[d,e] |
|---|---|---|---|---|
| Chlorobenzene | yes | yes | yes | yes |
| Chloroform | yes | yes | yes | yes |
| Toluene | yes | yes | yes | yes |
| IPA | yes | yes | yes | yes |
| Ethanol | yes | yes | yes | yes |
| Water | yes | yes | yes | yes |
| Acetic acid | yes | yes | yes | yes |
| Ethyl acetate | yes | yes | yes | yes |
| Nitroethane | yes | yes | yes | yes |
| Xylene (mixture of isomers) | yes | no | no | yes |
| NMP | yes | no | no | yes |
| DMF | yes | no | no | yes |
| DMSO | yes | no | no | yes |
| Cyclohexanone | yes | no | no | yes |
| Butanol | yes | no | no | yes |

[a] substrate maintained at temperature <100° C.
[b] paste and substrate maintained at room temperature
[c] as a function of the solid component content of the composition, the amount of solvent can be increased to values above 90% referred to 100 parts of ECA (solvent included)
[d] as a function of the materials of the ECA, the solvent and the concentration of the solid components, silkscreens are selected depending on material, mesh number and mesh tension
[e] substrate maintained at temperature <100° C.

Example 9 (Comparative)

By way of comparison, the formulation described in example 3 of CN 109320893 was reproduced.

The following table 5 shows the materials and the corresponding amounts used for the reproduction of such example.

TABLE 5

Composition of the product reported in example 3 of CN 108384103

| Material | Specifications (production and supply method) | Amount (mg) |
|---|---|---|
| graphene | Wet-jet milling exfoliation | 180 |
| carbon nanotubes | Cheap tubes | 30 |
| Carbon black | Alfa Aesar | 130 |
| Epoxy resin | Sigma Aldrich | 250 |
| Hydroxyl acrylic acid resin | Vecom Srl | 200 |
| Curing agent (1) | Sigma Aldrich | 180 |
| Aniline | Sigma Aldrich | 60 |
| Silicon nanopowder | Alfa Aesar | 40 |
| $FeSO_4 \cdot 7H_2O$ | Sigma Aldrich | 300 |
| $FeCl_3 \cdot 6H_2O$ | Sigma Aldrich | 150 |
| EVA (EVA-B) | Sigma Aldrich | 600 |
| White oil | Sigma Aldrich | 60 |
| Zirconium hydrogen phosphate | Sigma Aldrich | 10 |
| Butyl acrylate emulsion | Sigma Aldrich | 80 |
| NMP | Sigma Aldrich | 400 |
| Polytetrafluoroethylene | Sigma Aldrich | 80 |
| Polyvinylidene chloride emulsion | Sigma Aldrich | 130 |
| Sodium dodecyl sulfate | Sigma Aldrich | 30 |
| Auxiliary | Sigma Aldrich | 20 |

(1): curing agent: polyether amine

Figure 8:
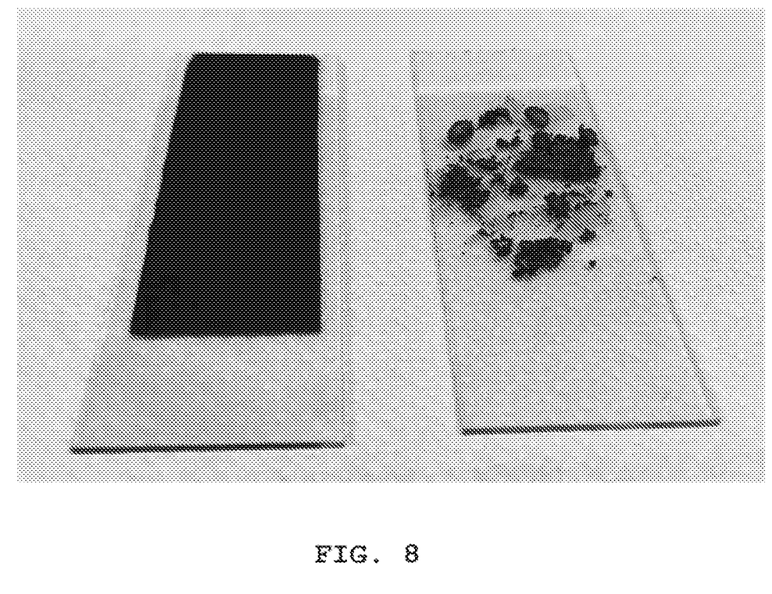
FIG. 8 is a photograph of the film deposited by doctor blading using the C-EVA-ECA-4 composition (on the left) compared with the material obtained in the comparative example 9 (on the right).

The material obtained is in a wet solid form formed by separate lumps, so that the material cannot be processed by the deposition methods previously described such as, in particular, by doctor blading, spin coating, spray coating and silkscreen printing. FIG. 8 shows a comparison of the film obtained by doctor-blade deposition of the C-EVA-ECA-4 product according to the invention (on the left) with the product obtained in this comparative example (on the right).

In order to measure the resistivity of the composite obtained, a lump of the material was pressed in the form of a film. The measured volumetric resistivity is 3.99 Ωcm which is about two orders of magnitude greater than that shown by the products according to the invention, using the same adhesive polymer component (EVA).

What is claimed is:

1. An electrically conductive adhesive composition, free of metals and metal salts, comprising:
   an adhesive polymer component selected from the group consisting of polyethylene-vinyl acetate, polyolefin elastomers, polyvinyl butyral, poly(acrylic acid), polyacrylates and poly(methyl methacrylate) in quantities ranging from 5% to 40% by weight,
   an electrically conductive component comprising acetylene or carbon black nanoparticles, carbon nanotubes and flakes or plates of graphene or graphene derivatives in quantities ranging from 60% to 95% by weight, percentages by weight being referred to 100 parts by weight of the adhesive polymer component and electrically conductive component,
   wherein said electrically conductive component consists of:
   acetylene or carbon black nanoparticles from 15% to 45% by weight,
   carbon nanotubes from 5% to 25% by weight, and
   flakes or plates of graphene or graphene derivatives from 35% to 70% by weight,
   the percentages by weight being referred to 100 parts by weight of said electrically conductive component, and
   a solvent compatible with the adhesive polymer component in quantities ranging from 50% to 90% by weight referred to 100 parts of the electrically conductive adhesive composition consisting of the adhesive polymer component, electrically conductive component and solvent.

2. The electrically conductive adhesive composition of claim 1, wherein said graphene derivatives are reduced graphene oxide.

3. The electrically conductive adhesive composition of claim 1, wherein said electrically conductive component consists of:
   acetylene black nanoparticles from 35% to 45% by weight,
   carbon nanotubes from 10% to 20% by weight, and
   graphene flakes from 35% to 45% by weight,
   the percentages by weight being referred to 100 parts by weight of said electrically conductive component.

4. The electrically conductive adhesive composition of claim 1, comprising from 20% to 30% by weight of the adhesive polymer component and from 70% to 80% by weight of the electrically conductive component, the percentages by weight being referred to 100 parts by weight of the adhesive polymer component and electrically conductive component.

5. The electrically conductive adhesive composition of claim 1, in the form of a curable paste, wherein said solvent is selected from the group consisting of chlorobenzene, xylene, chloroform, acetic acid, cyclohexanone, butanol, dimethylformamide, N-methylpyrrolidone, dimethylsulfoxide, nitroethane, toluene, ethyl acetate, chlorobenzene, cyclohexanone, isopranol, ethanol, water and mixtures thereof.

6. The electrically conductive adhesive composition of claim 1, wherein the adhesive polymer component is selected from polyethylene-vinyl acetate and polyolefin elastomers and the solvent is selected from the group consisting of chlorobenzene, xylene, chloroform and mixtures thereof.

7. The electrically conductive adhesive composition of claim 1, wherein the adhesive polymer component is polyvinyl butyral and the solvent is selected from the group consisting of acetic acid, butanol, cyclohexanone, dimethylsulfoxide, dimethylformamide, N-methylpyrrolidone and mixtures thereof.

8. The electrically conductive adhesive composition of claim 1, wherein the adhesive polymer component is polymethyl methacrylate and the solvent is selected from the group consisting of ethyl acetate, nitroethane, toluene, chloroform, chlorobenzene, cyclohexanone and mixtures thereof.

9. The electrically conductive adhesive composition of claim 1, wherein the adhesive polymer component is poly (acrylic acid) and the solvent is selected from isopropyl alcohol, ethanol and mixtures thereof.

10. The electrically conductive adhesive composition of claim 1, wherein the solvent has a vapor pressure higher than 0.8 kPa.

11. A process for preparing an electrically conductive adhesive composition, free of metals and metal salts, comprising:
    an adhesive polymer component selected from the group consisting of polyethylene-vinyl acetate, polyolefin elastomers, polyvinyl butyral, poly(acrylic acid), polyacrylates and poly(methyl methacrylate) in quantities ranging from 5% to 40% by weight,
    an electrically conductive component comprising acetylene or carbon black nanoparticles, carbon nanotubes and flakes or plates of graphene or graphene derivatives in quantities ranging from 60% to 95% by weight, percentages by weight being referred to 100 parts by weight of the adhesive polymer component and electrically conductive component, wherein said electrically conductive component consists of:

acetylene or carbon black nanoparticles from 15% to 45% by weight, carbon nanotubes from 5% to 25% by weight, and flakes or plates of graphene or graphene derivatives from 35% to 70% by weight, the percentages by weight being referred to 100 parts by weight of said electrically conductive component, and a solvent compatible with the adhesive polymer component in quantities ranging from 50% to 90% by weight referred to 100 parts of the electrically conductive adhesive composition consisting of the adhesive polymer component, electrically conductive component and solvent, the process comprising:

melting said adhesive polymer component and dissolving or dispersing the adhesive polymer component in the solvent compatible with the adhesive polymer component, and mixing the electrically conductive component with the adhesive polymer component in said solvent at a temperature between 40° C. and 60° C. to obtain a paste.

12. A method for producing silicon-based heterojunction solar cells comprising a copper (Cu) ribbon and a silver (Ag) busbar, said method comprising applying the electrically conductive adhesive composition of claim 1 for connecting said copper (Cu) ribbon to said silver (Ag) busbar at temperatures lower than 100° C.

13. A method for producing carbon-based back-electrodes in perovskite solar cells comprising a copper (Cu) ribbon and a silver (Ag) busbar, wherein the electrically conductive adhesive composition of claim 1 is applied for connecting said copper (Cu) ribbon to said silver (Ag) busbar at a temperature lower than 100° C., including room temperature.

14. A method for producing a mechanical and electrical serial type connection of electrodes in batteries, supercapacitors or multi-component electronic systems, wherein the electrically conductive adhesive composition of claim 1 is applied to provide said mechanical and electrical serial type connection.

* * * * *